(12) United States Patent
Lai et al.

(10) Patent No.: US 6,734,107 B2
(45) Date of Patent: May 11, 2004

(54) PITCH REDUCTION IN SEMICONDUCTOR FABRICATION

(75) Inventors: Jiun-Ren Lai, Hsinchu (TW); Chien-Wei Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 29 days.

(21) Appl. No.: 10/170,308

(22) Filed: Jun. 12, 2002

(65) Prior Publication Data

US 2003/0232474 A1 Dec. 18, 2003

(51) Int. Cl.⁷ .............................. H01L 21/311
(52) U.S. Cl. .................. 438/696; 438/694; 438/703; 438/735; 438/737; 438/738; 438/740
(58) Field of Search ................... 438/694, 696, 438/703, 735, 737, 738, 740

(56) References Cited

U.S. PATENT DOCUMENTS

| | | | | |
|---|---|---|---|---|
| 5,296,410 A | * | 3/1994 | Yang ........................ | 438/696 |
| 6,110,837 A | * | 8/2000 | Linliu et al. ............... | 438/723 |
| 6,218,310 B1 | * | 4/2001 | Shen et al. ................ | 438/714 |
| 6,548,385 B1 | * | 4/2003 | Lai ........................... | 438/552 |
| 6,653,231 B2 | * | 11/2003 | Okoroanyanwu et al. ... | 438/669 |

* cited by examiner

Primary Examiner—Richard Elms
Assistant Examiner—Christian D. Wilson
(74) Attorney, Agent, or Firm—Stout, Uxa, Buyan & Mullins, LLP (57) ABSTRACT

A method for forming transistor devices having a reduced pitch. The pitch of the formed devices can be reduced to, e.g., half that of conventional devices by using current photolithography conditions. Since the pitch of the devices can be reduced, the device integration can be increased, resulting in smaller and faster integrated circuits. In a preferred embodiment, a conductive layer, a stop layer, and a polysilicon layer are formed on a substrate. A patterned photoresist layer is formed on the polysilicon layer, and a first polymer layer is formed on surfaces of the photoresist layer. The first polymer layer is used as an etching mask to define the polysilicon layer, the stop layer, and the conductive layer. An oxide layer is formed on the substrate, and then the oxide layer is etched back until the polysilicon layer is exposed. The polysilicon layer is removed, and a second polymer layer is formed on surfaces of the oxide layer. The second polymer layer is used as an etching mask to define the conductive layer. Then, the second polymer layer is removed.

15 Claims, 10 Drawing Sheets

PITCH REDUCTION IN SEMICONDUCTOR FABRICATION

BACKGROUND OF THE INVENTION

1. Field of the Invention

The present invention relates generally to semiconductor fabrication methods and, more particularly, to methods for fabricating transistor devices having a reduced pitch.

2. Description of Related Art

Modern integrated circuits contain numerous structures that comprise conductive material, semi-conductive material (i.e., rendered conductive in defined areas with dopants), and/or non-conductive material. For example, transistor devices are commonly fabricated by forming a semi-conductive material, such as polycrystalline silicon (polysilicon) over a relatively thin gate dielectric arranged upon a semiconductor substrate. The polysilicon material is patterned to define gate conductors spaced laterally apart above the substrate. Along with the gate conductors, exposed regions of the substrate are implanted with impurity dopants to form source/drain junctions in the substrate between the gate conductors. If the dopant species employed for forming the source/drain regions is n-type, then an NMOSFET (n-channel) transistor device is formed. Conversely, if the source/drain dopant species is p-type, then a PMOSFET (p-channel) transistor device is formed. Integrated circuits utilize either n-channel devices exclusively, p-channel devices exclusively, or a combination of both on a single monolithic substrate.

Transistor gate conductors are defined using a technique known as photolithography. A photosensitive film, i.e., photoresist, is spin-deposited across the polysilicon material. An optical image is transferred to the photoresist by projecting a form of radiation, typically ultraviolet light, through the transparent portions of a mask plate. A photo-chemical reaction alters the solubility of the regions of the photoresist exposed to the radiation. The photoresist is washed with a solvent known as developer to preferentially remove the regions of higher solubility, followed by curing the remaining regions of the photoresist. Those remaining regions of the photoresist are highly resistant to attack by an etching agent that is capable of removing the polysilicon material. The portions of the polysilicon left exposed by the photoresist are etched away to define gate conductors of ensuing transistor devices.

Unfortunately, the minimum lateral dimension that can be achieved for a patterned photoresist feature is limited by, among other things, the resolution of the optical system used to project the image onto the photoresist. The term "resolution" describes the ability of an optical system to distinguish closely spaced objects. Diffraction effects may undesirably occur as the radiation passes through slit-like transparent regions of the mask plate, scattering the radiation and therefore adversely affecting the resolution of the optical system. As such, the photoresist regions exposed to the radiation fail to correspond to the mask plate pattern, resulting in the photoresist features being skewed. Consequently, the photolithography process limits the minimum achievable widths of the features of a conventional integrated circuit. It is therefore difficult to reduce the widths of and distances between for example transistor gate conductors, which are defined by the photolithography process.

Because of this limitation of the photolithography process, the pitch of for example transistor devices formed with conventional methods cannot be easily reduced. The "pitch" is herein defined as the distance between the same points of two adjacent structures of the same type, e.g., two adjacent gate conductors. Since the pitch of the devices cannot be easily reduced, the device integration cannot be increased to meet the high demand for smaller and faster integrated circuits.

A need thus exists in the prior art to reduce the pitch of transistor devices of an integrated circuit. A further need exists to develop a method for fabricating an integrated circuit in which the width of and distances between the gate conductors are not limited by the photolithography process.

SUMMARY OF THE INVENTION

The present invention addresses these needs by providing a method for forming transistor devices having a reduced pitch. The pitch of the formed devices can be reduced to, e.g., half that of conventional devices, by using current photolithography conditions. Since the pitch of the devices can be reduced, the device integration can be increased, resulting in smaller and faster integrated circuits.

In a preferred embodiment, a conductive layer, a stop layer, and a polysilicon layer are formed on a substrate. A patterned photoresist layer is formed on the polysilicon layer, and a first polymer layer is formed on surfaces of the photoresist layer. The first polymer layer is used as an etching mask to define the polysilicon layer, the stop layer, and the conductive layer. An oxide layer is formed on the substrate, and then the oxide layer is etched back until the polysilicon layer is exposed. The polysilicon layer is removed, and a second polymer layer is formed on surfaces of the oxide layer. The second polymer layer is used as an etching mask to define the conductive layer. Then, the second polymer layer is removed.

According to one aspect of the invention, transistors are formed using several process steps. A first conductive layer, a stop layer, and a second conductive layer are consecutively deposited on a semiconductor substrate. The first and second conductive layers may be composed of a conductive or semi-conductive material and are preferably composed of polysilicon. The stop layer may be a dielectric material having an etch rate less than an etch rate of the second conductive layer when using an etching agent (i.e., etchant) that is highly selective to the second conductive layer. If, for example, the conductive layers comprise polysilicon, the stop layer may be silicon nitride or silicon oxy-nitride. Subsequently, a photoresist layer is patterned on the second conductive layer using the photolithography process. A first dielectric layer is then selectively formed on surfaces of the photoresist layer. The first dielectric layer may be composed of a polymer created in an etcher using the dielectric resolution enhancement coating technique. The first conductive layer, the stop layer, and the second conductive layer are defined using the first dielectric layer as an etching mask. Having served their purpose, the photoresist layer and the first dielectric layer are then removed.

Next, an insulating layer is deposited on the substrate to a level above the second conductive layer. The insulating layer may be composed of an oxide, e.g., a spin on glass (SOG) oxide, such that its etch rate is less than the etch rate of the second conductive layer when an etchant that is highly selective to the second conductive layer is used. The insulating layer is then removed down to the upper surface of the second conductive layer, thereby exposing the second conductive layer. A dry etching process or a chemical-mechanical polishing (CMP) process may be employed to remove the insulating layer. The second conductive layer is then removed to expose the stop layer, followed by forming a second dielectric layer, e.g., a polymer, on surfaces of the insulating layer to serve as an etch mask. The dielectric resolution enhancement coating technique, which can be performed in an etcher, may be used to form the second dielectric layer. Subsequently, portions of the stop layer and first conductive layer not covered by the second dielectric layer may be removed.

The second dielectric layer is removed, leaving behind a plurality of gate conductors that are laterally spaced apart on a substrate, and an etch stop material positioned over the gate conductors. A gate dielectric is interposed between the substrate and the plurality of gate conductors. Transistor devices may be subsequently formed by implanting dopants into source/drain regions of the substrate located between the gate conductors. A lateral width of each gate conductor is substantially less than a lateral width of a feature of a conventional, patterned photoresist layer. Moreover, a pitch of the plurality of gate conductors is substantially less than a pitch of features of a conventional, patterned photoresist layer. The resulting pitch of the transistor devices fabricated according to this method is significantly reduced compared to the pitch of conventional transistor devices.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

DETAILED DESCRIPTION OF THE PRESENTLY PREFERRED EMBODIMENTS

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. For example, it is understood by a person of ordinary skill practicing this invention that the fabrication method in accordance with the present invention includes selectively etching a conductive polysilicon layer that has a selectivity to an etchant that is greater than the selectivity (to the same etchant) of an underlying stop layer. Hence, different conductive materials, different stop layer materials, different etchants, and different combinations thereof, can be implemented in accordance with the present invention.

It is to be understood and appreciated that the process steps and structures described herein do not cover a complete process flow for the manufacture of transistor devices. The present invention may be practiced in conjunction with various integrated circuit fabrication techniques that are conventionally used in the art, and only so much of the commonly practiced process steps are included herein as are necessary to provide an understanding of the present invention.

Figure 1:
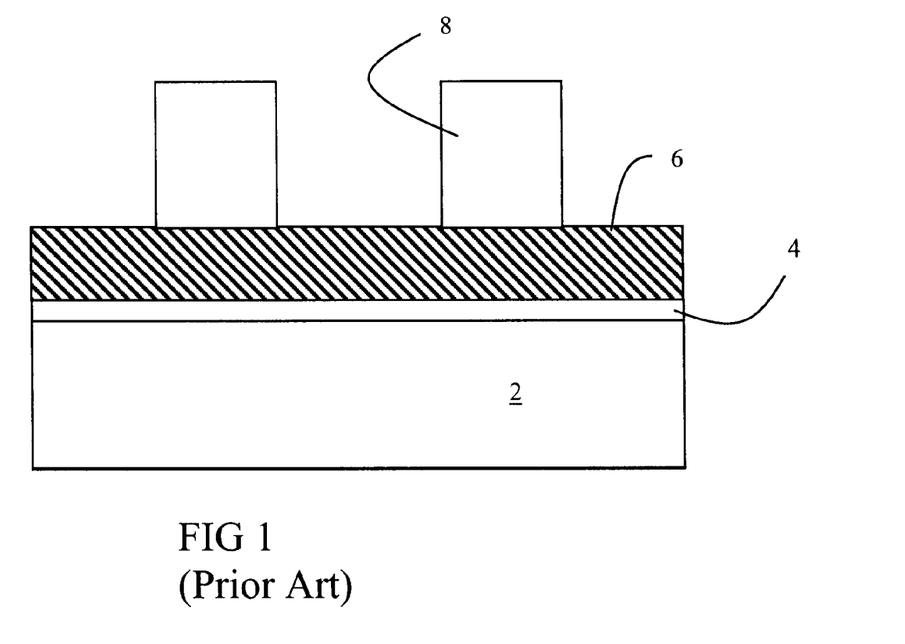
FIG. 1 is a cross-sectional view of a prior art silicon substrate upon which gate oxide layer and a polysilicon layer has been formed, wherein a photoresist layer is patterned upon the polysilicon layer in accordance with a conventional fabrication method.
Figure 2:
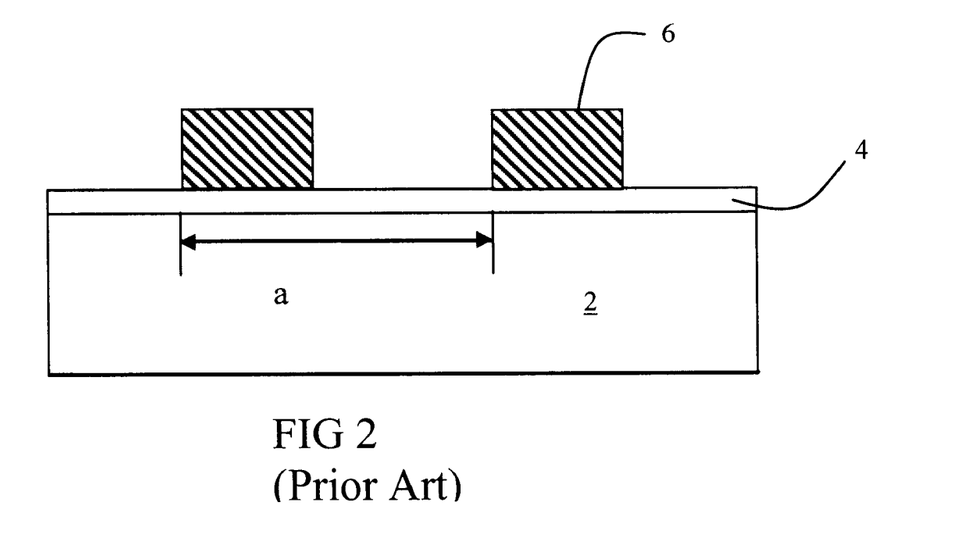
FIG. 2 is a cross-sectional view of the prior-art configuration depicted in FIG. 1, wherein the polysilicon layer is defined using the photoresist layer as an etch mask.

Referring more particularly to the drawings, FIGS. 1 and 2 illustrate a prior-art fabrication method used to form gate conductors of transistor devices. As shown in FIG. 1, a gate oxide layer 4 comprising silicon dioxide ($SiO_2$) is formed on a silicon substrate 2. The relatively thin gate oxide layer 4 is thermally grown at the surface of substrate 2 by heating the substrate while exposing it to oxygen gas. Polysilicon layer 6 is formed across gate oxide layer 4 using chemical vapor deposition (CVD) from a silane ($SiH_4$) source. The photolithography process described above is then used to pattern photoresist layer 8 on polysilicon layer 6. Drawbacks of the photolithography process limit the minimum dimension that can be achieved for the features of photoresist layer 8.

Next, as depicted in FIG. 2, an etch technique, such as a dry, plasma etch is performed to remove portions of polysilicon layer 6 not covered by photoresist layer 8. Photoresist layer 8 is highly resistant to attack by the etchant, which is highly selective to polysilicon. As such, photoresist layer 8 acts as an etching mask during the patterning of polysilicon layer 6. In this manner, gate conductors are defined in polysilicon layer 6 that have widths approximately equal to the widths of the overlying photoresist features. Photoresist layer 8 is stripped from the surfaces of polysilicon layer 6 after the etch process. The distance "a" between the vertical left surfaces of the two gate conductors shown in FIG. 2 represents the pitch of the gate conductors and thus the pitch of conventional transistor devices. The minimum size of pitch "a" is limited by the photolithography process and thus cannot be easily reduced using conventional fabrication methods.

Figure 3:
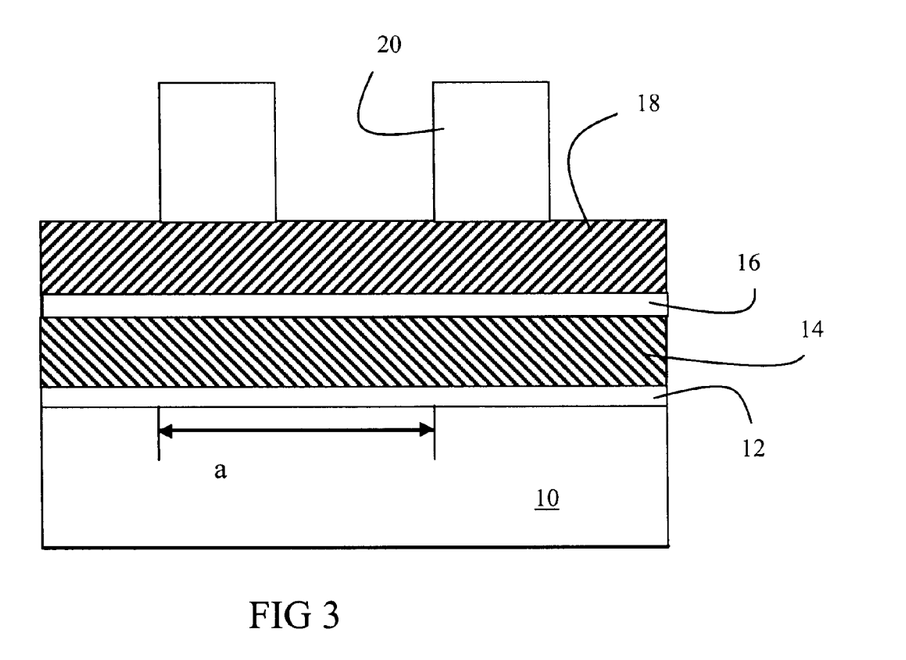
FIG. 3 is a cross-sectional view of a silicon substrate upon which a gate oxide layer/first polysilicon layer/stop layer/second polysilicon layer film stack has been formed, wherein a photoresist layer is patterned upon the film stack in accordance with a preferred embodiment of the invention.

FIG. 3 illustrates the formation of a patterned photoresist layer on a multi-layer film stack. More particularly, a gate oxide layer 12, a first polysilicon layer 14, a stop layer 16, and a second polysilicon layer 18 are sequentially formed on a substrate 10. Although substrate 10 preferably comprises single crystalline silicon, in alternative embodiments substrate 10 can comprise materials such as gallium nitride (GaN), gallium arsenide (GaAs), or other materials commonly recognized as suitable semiconductor materials to those skilled in the art. Substrate 10 may be slightly doped with p-type dopants (e.g., arsenic, phosphorus, and antimony) or n-type dopants (e.g., boron and boron difluoride). Gate oxide layer 12 preferably comprises silicon dioxide ($SiO_2$), which may be formed by thermal oxidation of silicon substrate 10. During thermal oxidation, silicon substrate 10 is exposed to thermal radiation in an oxygen-bearing ambient to form $SiO_2$ at the substrate's surface. In alternative embodiments, gate oxide layer 12 can be replaced with other dielectric materials recognized as suitable to those skilled in the art.

First polysilicon layer 14 can be deposited by CVD on gate oxide layer 12, and second polysilicon layer 18 can be deposited by CVD on stop layer 16. The CVD of polysilicon involves the decomposition of $SiH_4$ gas into solid silicon (Si) and hydrogen gas ($H_2$). Substrate 10 is placed in a CVD reaction chamber with controlled reaction conditions, and $SiH_4$ gas is supplied to the reaction chamber, resulting in the formation of a solid layer of silicon at the surface of the substrate. It is contemplated that other conductive or semiconductive materials may be substituted for polysilicon layers 14 and 18. Polysilicon layer 14 can be doped with p-type or n-type dopants during or subsequent to its deposition to render polysilicon layer 14 conductive.

Stop layer 16 comprises a material that has an etch rate less than the etch rate of polysilicon layer 18 when subjected to an etchant that is highly selective to polysilicon. Preferably, stop layer 16 comprises silicon nitride ($Si_3N_4$) that is deposited by CVD from a plasma containing dichlorosilane ($SiH_2Cl_2$) and either ammonia ($NH_3$) or nitrogen gas ($N_2$). Alternatively, stop layer 16 can be a silicon oxy-nitride (SiON) layer formed by CVD from a plasma containing $SiH_4$ and either $NH_3$ or nitrous oxide ($N_2O$), or may comprise silicon oxide.

Patterned photoresist layer 20 is formed on second polysilicon layer 18 using optical photolithography. As is common in the art, a layer of photoresist is first spun onto the wafer. The wafer is then placed into a patterning tool known as a "stepper" where it is aligned to a mask plate and exposed to ultraviolet (UV) radiation. The mask may only be large enough to cover a small portion of the wafer, in which case the stepper steps the wafer through many quadrants, each of them being exposed in turn until the entire or desired portion of the wafer has been exposed to UV light. The wafer is then placed in a developer solution that dissolves portions of the photoresist that were exposed to the UV radiation, thereby yielding patterned photoresist layer 20. In the illustrated embodiment, the minimum size of pitch "a" of features of the patterned photoresist layer 20 is as small as the photolithography process will allow.

Figure 4:
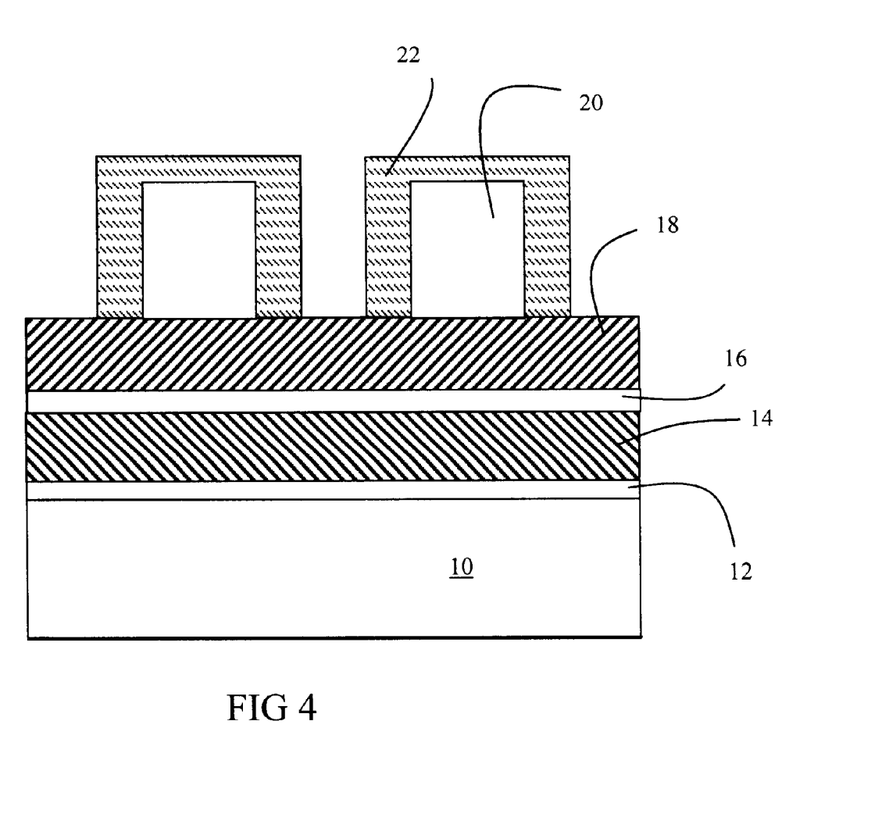
FIG. 4 is a cross-sectional view of the configuration depicted in FIG. 3, wherein a first polymer layer is formed on surfaces of the photoresist layer in accordance with a preferred embodiment of the invention.

As shown in FIG. 4, a first polymer layer 22 is selectively formed on surfaces of photoresist layer 20 with a dielectric resolution enhancement coating technique that is performed, for example, in an etcher. The first polymer layer 22 can be formed using, for example, in whole or in part, the methods and apparatus disclosed in co-pending U.S. application Ser. No. 09/978,546, the contents of which are incorporated herein by reference. Regarding formation of the first polymer layer 22, an etcher can be utilized in combination with a recipe for controlling the deposition/etching ratio in reaction so as to form the first polymer layer 22 on the side walls and/or top surfaces of the photoresist layer 20. The reactive gas used in the reaction is preferably one unable to react with the underlayer such as the polysilicon layer 18 (see, e.g., FIG. 4) or the stop layer 16 (see, e.g., FIG. 19). In the illustrated embodiment, the first polymer layer 22 is formed using $CH_2F_2$ and $C_4F_8$ gas in a dual plasma etcher.

Figure 5:
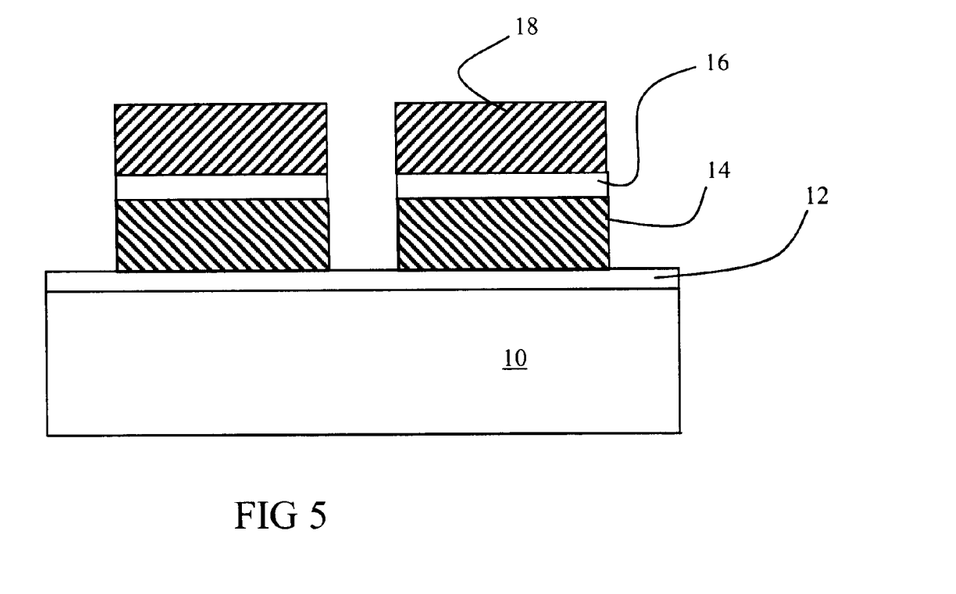
FIG. 5 is a cross-sectional view of the configuration depicted in FIG. 4, wherein the first polysilicon layer, the stop layer, and the second polysilicon layer are defined using the first polymer layer as an etch mask in accordance with a preferred embodiment of the invention.

Turning to FIG. 5, first polymer layer 22 serves as an etching mask to pattern polysilicon layers 14 and 18 and stop layer 16, thereby leaving portions of gate oxide layer 12 exposed. Polysilicon layers 14 and 18 and etch stop layer 16 are patterned using a well-known etch technique. In a preferred embodiment, an anisotropic (i.e., ion bombardment greater in the vertical direction than in the horizontal direction) high-pressure plasma etch is used that has a high etch rate to polysilicon and the stop layer and a relatively low etch rate to the polymer. As presently embodied, the etch duration is selected to terminate before substantial portions of gate oxide layer 12 can be removed. An example of an appropriate etch chemistry is carbon tetrafluoride ($CF_4$)/oxygen gas ($O_2$)/$H_2$. It is contemplated that other materials, such as other dielectric materials, may be substituted for first polymer layer 22, so long as those materials can be selectively formed on photoresist layer 20 and can act as an etch mask. After polysilicon layers 14 and 18 and stop layer 16 are defined, the wafer is placed into a chemical bath solution which removes first polymer layer 22 and remaining photoresist layer 20, resulting in the topography depicted in FIG. 5.

Figure 6:
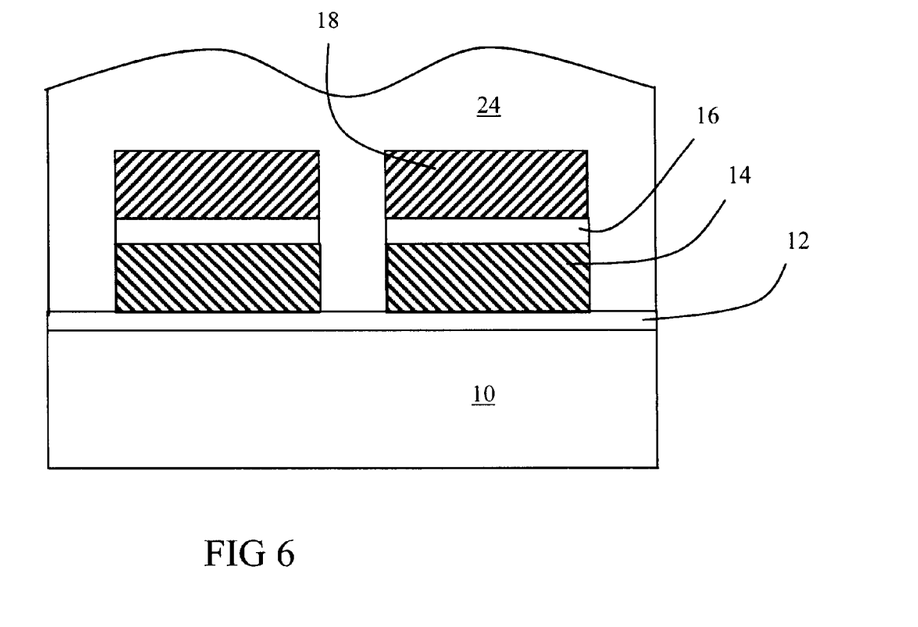
FIG. 6 is a cross-sectional view of the configuration depicted in FIG. 5, wherein an oxide layer is formed on the substrate in accordance with a preferred embodiment of the invention.

Subsequently, as shown in FIG. 6, an oxide layer 24 is formed across the configuration depicted in FIG. 5 to cover polysilicon layers 14 and 18 and stop layer 16. Oxide layer 24 can be a SOG-oxide layer that is spin-deposited to a level above second polysilicon layer 18. An etch rate of oxide layer 24 is advantageously lower than an etch rate of second polysilicon layer 18 with respect to an etchant that is highly reactive with polysilicon. In alternative embodiments, other materials, such as other insulating materials, deemed appropriate by those skilled in the art can be substituted for oxide layer 24.

Figure 7:
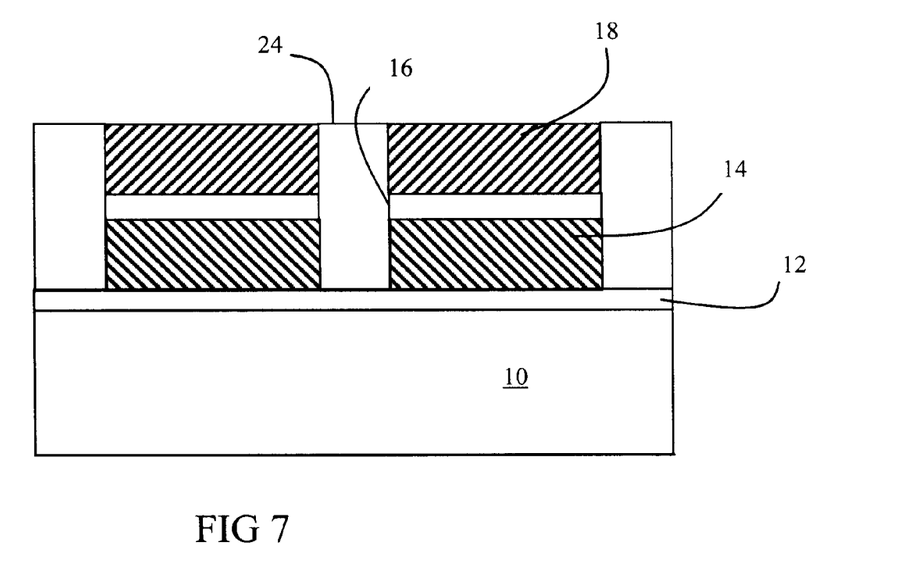
FIG. 7 is a cross-sectional view of the configuration depicted in FIG. 6, wherein the oxide layer is removed down to the upper surface of the second polysilicon layer in accordance with a preferred embodiment of the invention.

FIG. 7 illustrates oxide layer 24 being etched back until second polysilicon layer 18 is exposed. The wafer may be placed within a dry etcher to remove oxide layer 24, and the etchant may be, e.g., a $CF_4$/argon (Ar) plasma. Alternatively, oxide layer 24 may be removed down to the level of the upper surface of second polysilicon layer 18 using CMP. The CMP process entails mechanically abrading the wafer in an alkaline slurry containing colloidal silica (a suspension of abrasive $SiO_2$) and an etching agent, such as dilute hydrofluoric acid (HF). In this manner, a globally flat surface is achieved at the top of the topography illustrated in FIG. 7.

Figure 8:
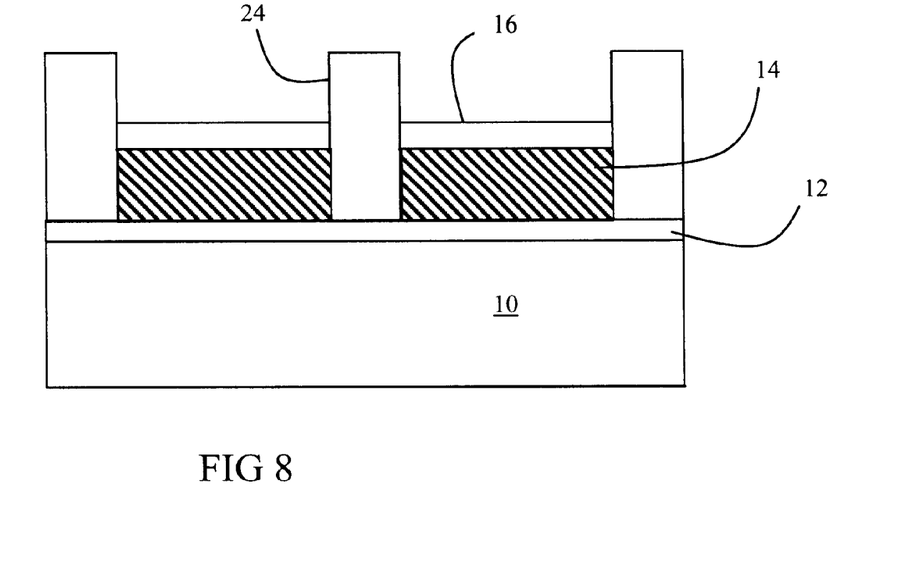
FIG. 8 is a cross-sectional view of the configuration depicted in FIG. 7, wherein the second polysilicon layer is removed to expose the stop layer in accordance with a preferred embodiment of the invention.

Next, as shown in FIG. 8, second polysilicon layer 18 is removed with an in-situ process, wherein the wafer is left within the same etcher previously employed to etch back oxide layer 24. More particularly, second polysilicon layer 18 is anisotropically etched with a plasma, e.g., hydrogen bromide (HBr)/He/$O_2$, having a higher selectivity for silicon than for dielectric materials. In one embodiment the selected plasma has a higher selectivity for second polysilicon layer 18 than for oxide layer 24, and in another embodiment the selected plasma has a higher selectivity for second polysilicon layer 18 than for oxide layer 24 and stop layer 16. Second polysilicon layer 18 is etched for a time sufficient to completely remove the second polysilicon layer, at which point the dry, plasma etch is terminated before substantial portions of stop layer 16 are removed.

Figure 9:
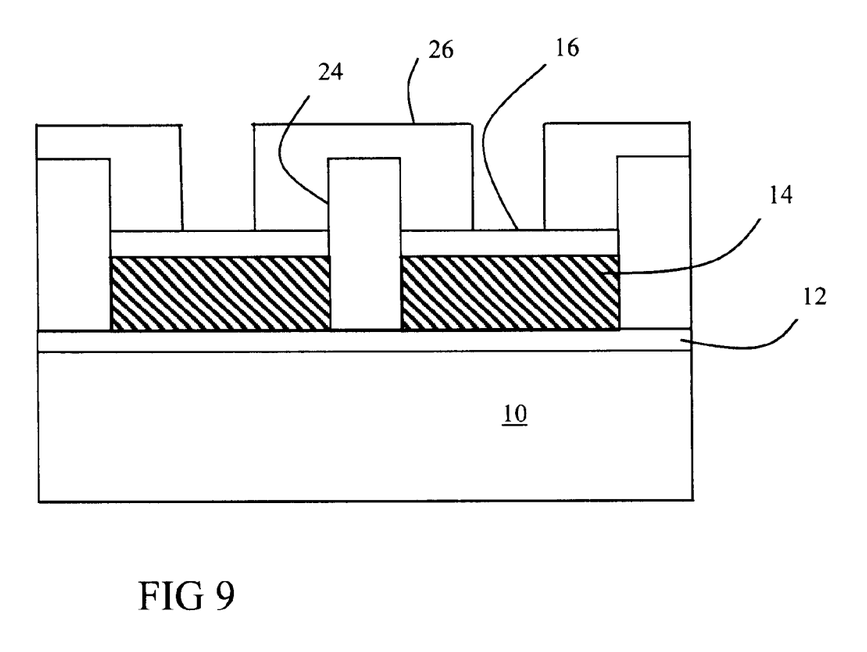
FIG. 9 is a cross-sectional view of the configuration depicted in FIG. 8, wherein a second polymer layer is formed on the surfaces of the oxide layer in accordance with a preferred embodiment of the invention.

FIG. 9 depicts a second polymer layer 26 being formed on surfaces of oxide layer 24 with the above-described dielectric resolution enhancement coating technique that is performed in for example an etcher. Second polymer layer 26 serves as an etching mask to pattern stop layer 16 and first polysilicon layer 14 during an etch technique, e.g., an anisotropic high-pressure plasma etch technique using a $CF_4$/$O_2$/$H_2$ plasma. The etchant is preferably relatively unreactive with second polymer layer 26. The etch duration is chosen to terminate before substantial portions of gate oxide layer 12 are removed. It is contemplated that second polymer layer 26 may be replaced with other materials, such as other dielectric materials, that can be selectively formed on oxide layer 24 and that can act as an etch mask.

Figure 10:
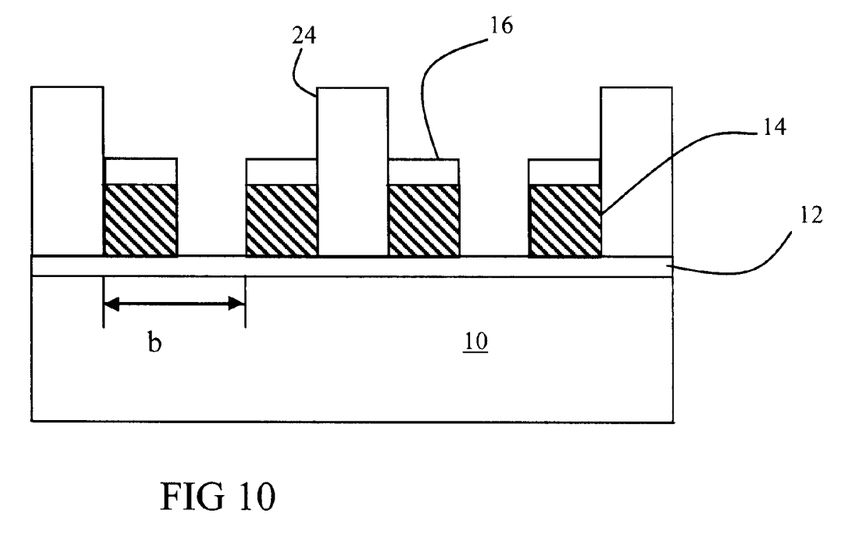
FIG. 10 is a cross-sectional view of the configuration depicted in FIG. 9, wherein the first polysilicon layer and the stop layer are defined using the second polymer layer as an etching mask.

Next, second polymer layer 26 is removed using, e.g., an ash technique, leaving behind a plurality of gate conductors having a reduced pitch, as depicted in FIG. 10. Following a removal of stop layer 16 and oxide layer 24, transistor devices may be formed by implanting dopants into the source/drain junctions of substrate 10, which are located between the gate conductors defined in first polysilicon layer 14. In the illustrated embodiment, the spacing between two adjacent gate conductors is relatively the same. The distance "b" represents the pitch of the gate conductors, and thus of ensuing transistor devices formed in accordance with the present invention. A comparison of pitch "a" in FIG. 2 and pitch "b" in FIG. 10 reveals that pitch "b" is about half of pitch "a." Moreover, it can also be seen from a comparison of FIGS. 2, 3 and 10 that a lateral width of each gate conductor is substantially less than a minimum lateral width that a photolithography process will allow. Therefore, the present invention provides a method for using current photolithography process conditions to form transistor devices having less pitch than the pitch of conventional transistor devices. Since the pitch of the devices can be reduced, the device integration can be increased.

The above-described embodiments have been provided by way of example, and the present invention is not limited to these examples. Multiple variations and modification to the disclosed embodiments will occur, to the extent not mutually exclusive, to those skilled in the art upon consideration of the foregoing description. Such variations and modifications, however, fall well within the scope of the present invention as set forth in the following claims.

What is claimed is:

1. A method for forming transistors having a reduced pitch, comprising:
   providing a substrate having a first conductive layer, a stop layer, and a second conductive layer formed thereon;
   forming a patterned photoresist layer on the second conductive layer;
   forming a first dielectric layer on surfaces of the photoresist layer;
   defining the first conductive layer, the stop layer, and the second conductive layer using the first dielectric layer as an etching mask;
   removing the photoresist layer and the first dielectric layer;
   forming an insulating layer over the substrate;
   removing the insulating layer down to an upper surface of the second conductive layer, thereby exposing the second conductive layer;
   removing the second conductive layer;
   forming a second dielectric layer on surfaces of the insulating layer;
   defining the stop layer and the first conductive layer using the second dielectric layer as an etching mask; and
   removing the second dielectric layer.

2. The method of claim 1, wherein the removing of the second conductive layer comprises etching the second conductive layer, wherein an etch rate of the insulating layer is less than an etch rate of the second conductive layer.

3. The method of claim 2, wherein the stop layer is selected from the group comprising silicon oxide, silicon nitride and silicon oxy-nitride.

4. The method of claim 1, wherein the first and second conductive layers comprise polysilicon.

5. The method of claim 1, wherein the first and second dielectric layers comprise a polymer formed in an etcher.

6. The method of claim 5, wherein the insulating layer comprises oxide.

7. The method of claim 1, wherein the removing of the second conductive layer comprises using a dry etching process.

8. The method of claim 1, wherein the removing of the insulating layer comprises using a dry etching process.

9. The method of claim 1, wherein the removing the insulating layer comprises chemical-mechanical polishing the insulating layer.

10. A method for forming transistors having a reduced pitch, comprising:

providing a substrate having a defined first conductive layer capped with a defined stop layer, and further having a defined insulating layer interdispersed with the first conductive layer and the stop layer so that at least a portion of the interdispersed defined insulating layer has a height greater than a combined height of both the first conductive layer and the stop layer;

forming a polymer layer on exposed surfaces of the defined insulating layer;

defining the stop layer and the first conductive layer using the polymer layer as an etching mask; and removing the polymer layer.

11. The method of claim 10, wherein the providing of a substrate comprises:

forming the first conductive layer, the stop layer, and a second conductive layer on a substrate;

forming a patterned photoresist layer on the second conductive layer;

forming a polymer layer on surfaces of the photoresist layer;

defining the first conductive layer, the stop layer, and the second conductive layer using the polymer layer on the photoresist layer as an etching mask;

removing the polymer layer from the photoresist layer and removing the photoresist layer;

forming an insulating layer on the substrate;

removing the insulating layer down to an upper surface of the second conductive layer, thereby forming the defined insulating layer and exposing the second conductive layer; and removing the second conductive layer.

12. The method of claim 11, wherein the removing of the second conductive layer comprises etching the second conductive layer, wherein an etch rate of the insulating layer is less than an etch rate of the second conductive layer.

13. The method of claim 11, wherein:

the stop layer is selected from the group comprising silicon oxide, silicon nitride and silicon oxy-nitride; and the insulating layer comprises oxide.

14. The method of claim 11, wherein:

the forming a patterned photoresist layer comprises forming photoresist features using a photolithographic process; and a pitch of the photoresist features is as small as the photolithography process will allow.

15. A structure formed using the method of claim 14.

* * * * *